US012671443B2

(12) United States Patent
Sforzin et al.

(10) Patent No.: US 12,671,443 B2
(45) **Date of Patent: *Jun. 30, 2026**

(54) ERROR CORRECTION

(71) Applicant: Micron Technology, Inc., Boise, ID (US)

(72) Inventors: Marco Sforzin, Cernusco Sul Naviglio (IT); Paolo Amato, Treviglio (IT); Yang Lu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 17 days.

This patent is subject to a terminal disclaimer.

(21) Appl. No.: 18/813,896

(22) Filed: Aug. 23, 2024

(65) Prior Publication Data

US 2024/0429944 A1 Dec. 26, 2024

Related U.S. Application Data

(63) Continuation of application No. 17/969,856, filed on Oct. 20, 2022, now Pat. No. 12,074,615.

(60) Provisional application No. 63/348,438, filed on Jun. 2, 2022.

(51) Int. Cl.
*H03M 13/15* (2006.01)
*G06F 13/42* (2006.01)
*H03M 13/09* (2006.01)

(52) U.S. Cl.
CPC ...... *H03M 13/152* (2013.01); *G06F 13/4221* (2013.01); *H03M 13/095* (2013.01)

(58) Field of Classification Search
CPC .............. H03M 13/152; H03M 13/095; G06F 13/4221
See application file for complete search history.

(56) References Cited

U.S. PATENT DOCUMENTS

| | | | |
|---|---|---|---|
| 8,103,928 B2 | 1/2012 | Hargan | |
| 8,707,122 B1 | 4/2014 | Micheloni et al. | |
| 12,074,615 B2 * | 8/2024 | Sforzin | H03M 13/095 |
| 2009/0249156 A1 * | 10/2009 | Wang | G06F 3/064 |
| | | | 714/E11.131 |
| 2015/0370750 A1 * | 12/2015 | Eilert | G06F 13/4247 |
| | | | 710/308 |
| 2016/0299812 A1 | 10/2016 | Olbrich et al. | |
| 2016/0299844 A1 | 10/2016 | Sprouse et al. | |

* cited by examiner

*Primary Examiner* — Thien Nguyen
(74) *Attorney, Agent, or Firm* — Brooks, Cameron & Huebsch, PLLC

(57) ABSTRACT

Methods, systems, and devices related to mapping a plurality of pairs of bits of a memory transfer block (MTB) to a plurality of linked (LK) die input/output (LDIO) lines coupling a LK die to an interface (IF) die. The plurality of pairs of bits of the MTB can be communicated from the LK die to the IF die via the plurality of LDIO lines. Responsive to a failure of one of the plurality of LDIO lines, a Bose-Chaudhuri-Hocquenghem (BCH) error correction can be performed on the pairs of bits mapped to the failed LDIO line. Each of the plurality of pairs of bits is a respective symbol for the BCH error correction.

20 Claims, 6 Drawing Sheets

438

| | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| DQ0 | 1 | 19 | 37 | 55 | 1 | 19 | 37 | 55 | 10 | 28 | 46 | 64 | 10 | 28 | 46 | 64 |
| DQ1 | 2 | 20 | 38 | 56 | 2 | 20 | 38 | 56 | 11 | 29 | 47 | 65 | 11 | 29 | 47 | 65 |
| DQ2 | 3 | 21 | 39 | 57 | 3 | 21 | 39 | 57 | 12 | 30 | 48 | 66 | 12 | 30 | 48 | 66 |
| DQ3 | 4 | 22 | 40 | 58 | 4 | 22 | 40 | 58 | 13 | 31 | 49 | 67 | 13 | 31 | 49 | 67 |
| DQ4 | 5 | 23 | 41 | 59 | 5 | 23 | 41 | 59 | 14 | 32 | 50 | 68 | 14 | 32 | 50 | 68 |
| DQ5 | 6 | 24 | 42 | 60 | 6 | 24 | 42 | 60 | 15 | 33 | 51 | 69 | 15 | 33 | 51 | 69 |
| DQ6 | 7 | 25 | 43 | 61 | 7 | 25 | 43 | 61 | 16 | 34 | 52 | 70 | 16 | 34 | 52 | 70 |
| DQ7 | 8 | 26 | 44 | 62 | 8 | 26 | 44 | 62 | 17 | 35 | 53 | 71 | 17 | 35 | 53 | 71 |
| DMI | 9 | 27 | 45 | 63 | 9 | 27 | 45 | 63 | 18 | 36 | 54 | 72 | 18 | 36 | 54 | 72 |

450  451  452  453  454

ERROR CORRECTION

PRIORITY INFORMATION

This application is a continuation of U.S. application Ser. No. 17/969,856 filed on Oct. 20, 2022, which claims the benefit of U.S. Provisional Application Ser. No. 63/348,438 filed on Jun. 2, 2022, the contents of which are incorporated herein by reference.

TECHNICAL FIELD

The present disclosure relates generally to semiconductor memory and methods, and more particularly, to apparatuses, systems, and methods of error correction.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes Random Access Memory (RAM), Dynamic Random Access Memory (DRAM), Static Random Access Memory (SRAM), Synchronous Dynamic Random Access Memory (SDRAM), and Thyristor Random Access Memory (TRAM), among others. Non-volatile memory can provide persistent data by retaining stored data when not powered and can include NAND flash memory, NOR flash memory, Ferroelectric Random Access Memory (FeRAM), and resistance variable memory such as Phase Change Random Access Memory (PCRAM), Resistive Random Access Memory (RRAM), and Magnetoresistive Random Access Memory (MRAM), such as Spin Torque Transfer Random Access Memory (STTRAM), among others.

Memory devices may be coupled to a host (e.g., a host computing device) to store data, commands, and/or instructions for use by the host while the computer or electronic system is operating. For example, data, commands, and/or instructions can be transferred between the host and the memory device(s) during operation of a computing or other electronic system. A controller may be used to manage the transfer of data, commands, and/or instructions between the host and the memory devices.

DETAILED DESCRIPTION

Figure 1:
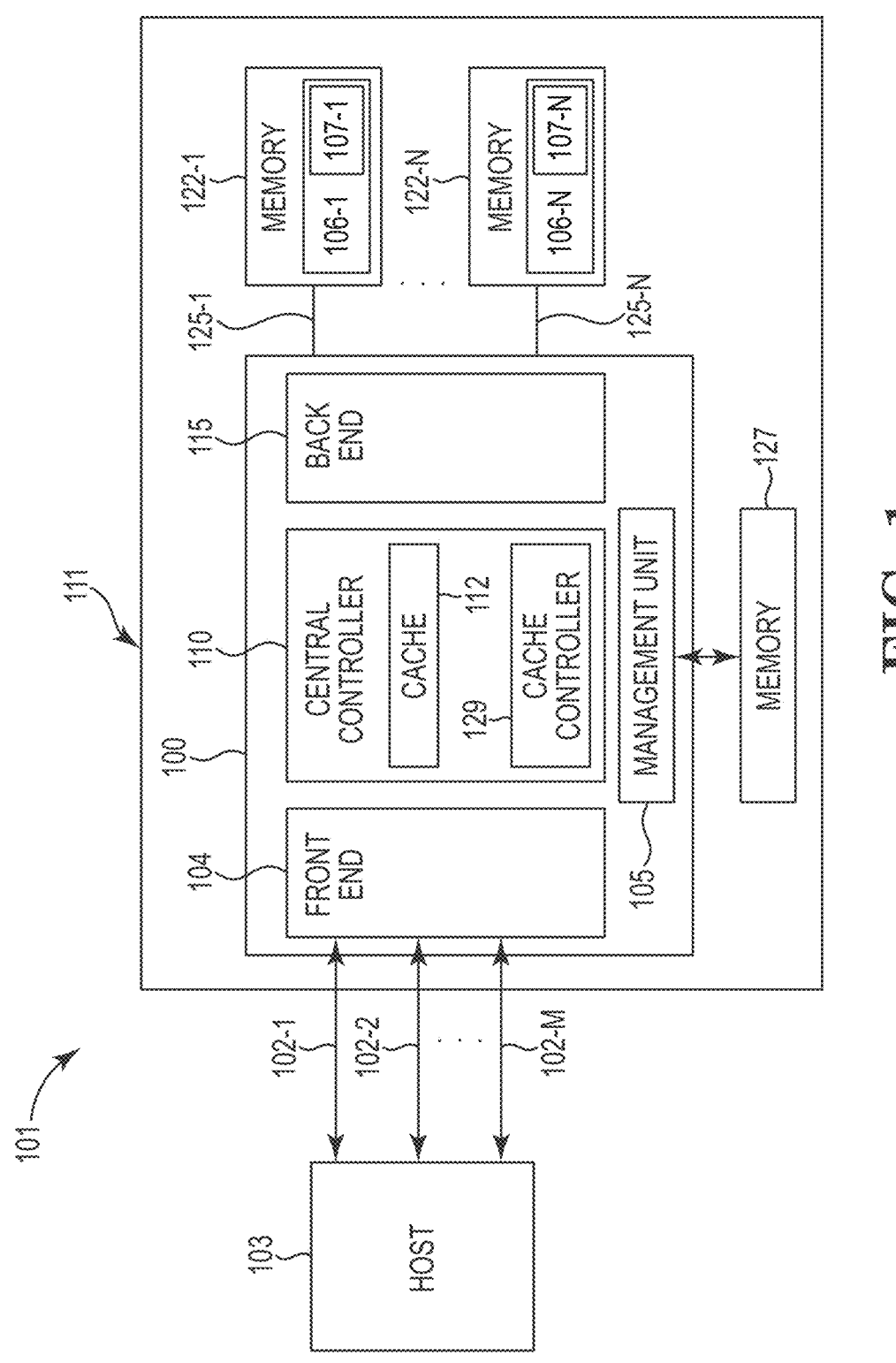
FIG. 1 illustrates a functional block diagram in the form of a computing system including a controller for error correction in accordance with a number of embodiments of the present disclosure.

Systems, apparatuses, and methods related to error correction are described. In some embodiments, a memory device can include a linked-interface (LK-IF) architecture. A non-limiting example of a LK-IF architecture includes 2 memory dies: an IF die and a LK die. The IF can be directly coupled to the LK die via input/output (IO) lines (also referred to as LK die IO (LDIO) lines). The IF and LK dies are accessed in parallel, via the IF die, so as to communicate a memory transfer block (MTB) over a single bus (e.g., a data (DQ) bus). The DQ bus can be directly coupled to the IF die and accessed by the IF die, not the LK die. The DQ bus can have a length of 32 bits. Sixteen of the 32 bits can be from the IF die and the remaining 16 of the 32 bits can be from the LK die.

In some embodiments, the DQ bus can include 9 lines:8 data (DQ) lines and 1 parity (DMI) line. Communication of an MTB via the DQ bus can include communicating the 16 bits from the LK die via each of the 9 lines (144 bits total). The IF die can be coupled to the LK die by 36 LDIO lines. Four of the 144 bits is communicated via each of the 36 LDIO lines. Thus, a failure of one of the LDIO lines results in 4-bit errors.

Some previous approaches include attempting to correct the whole 4-bit error if a LDIO line fails. Aspects of the present disclosure address this and other deficiencies of previous approaches by defining pairs of bits to be communicated via each of the LDIO lines. These pairs can correspond to symbols for error correction such that reliability of memory devices is improved by correcting errors from failed communication via one or more LDIO lines. As described herein, some embodiments can use fewer bits to correct errors such that these saved bits can be used for other purposes.

As used herein, the singular forms "a," "an," and "the" include singular and plural referents unless the content clearly dictates otherwise. Furthermore, the word "may" is used throughout this application in a permissive sense (i.e., having the potential to, being able to), not in a mandatory sense (i.e., must). The term "include," and derivations thereof, mean "including, but not limited to." As used herein, "coupled to" or "coupled with" generally refers to a connection between components, which can be an indirect communicative connection or direct communicative connection (e.g., without intervening components), whether wired or wireless, including connections such as electrical, optical, magnetic, and the like. The terms "data" and "data values" are used interchangeably herein and can have the same meaning, as appropriate to the context.

The figures herein follow a numbering convention in which the first digit or digits correspond to the drawing figure number and the remaining digits identify an element or component in the drawing. Similar elements or components between different figures may be identified by the use of similar digits. For example, element 122 can represent element 22 in FIG. 1, and a similar element can be labeled 222 in FIG. 2. Analogous elements within a figure may be referenced with a hyphen and extra numeral or letter. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention and should not be taken in a limiting sense.

FIG. 1 illustrates a functional block diagram in the form of a computing system 101 including a controller 100 (which may be referred to as a "memory controller") for error correction in accordance with a number of embodiments of the present disclosure. The computing system 101 includes a memory module 111. The memory module 111 can include the controller 100 and one or more memories and/or memory devices coupled thereto.

The controller 100 can include a front end portion 104, a central controller portion 110, and a back end portion 115. The computing system 101 can further include a host 103, memory devices 122-1, . . . , 122-N (collectively referred to as memory devices 122), and a memory 127. The memory 127 can be a flash memory accessible via a serial peripheral interface (SPI). The memory 127 can include other circuitry, firmware, software, or the like, whether alone or in combination.

The front end portion 104 includes an interface to couple the controller 100 to the host 103 through input/output (I/O) lanes 102-1, 102-2, . . . , 102-M (collectively referred to as I/O lanes 102). The front end portion includes interface management circuitry to manage the I/O lanes 102. The front end portion can include any quantity of the I/O lanes 102 (e.g., eight, sixteen I/O lanes 102). In some embodiments, the I/O lanes 102 can be configured as a single port. In some embodiments, the interface between the controller 100 and the host 103 can be a Peripheral Component Interconnect express (PCIe) physical and electrical interface operated according to a Compute Express Link (CXL) protocol.

In some embodiments, the computing system 101 can be a CXL compliant memory system (e.g., the memory system can include a PCIe/CXL interface). CXL is a high-speed central processing unit (CPU)-to-device and CPU-to-memory interconnect designed to accelerate next-generation data center performance. CXL technology maintains memory coherency between the CPU memory space and memory on attached devices, which allows resource sharing for higher performance, reduced software stack complexity, and lower overall system cost.

CXL is designed to be an industry open standard interface for high-speed communications, as accelerators are increasingly used to complement CPUs in support of emerging applications such as artificial intelligence and machine learning. CXL technology is built on the peripheral component interconnect express (PCIe) infrastructure, leveraging PCIe physical and electrical interfaces to provide advanced protocol in areas such as I/O protocol, memory protocol (e.g., initially allowing a host to share memory with an accelerator), and coherency interface.

The central controller portion 110 includes a cache memory 112 (alternatively referred to as a cache). In some embodiments, in response to receiving a read request for data stored in the cache memory 112, the data can be provided to the host 103 as requested without further accessing the memory device 122. In some embodiments, in response to receiving a write request, data can be stored in the cache memory 112 prior to writing the data to the memory device 122.

The central controller portion 110 can control, in response to receiving a memory access request from the host 103, for example, performance of one or more memory operations. Non-limiting examples of memory operations include a memory operation to read data from the cache memory 112 and/or a memory device 122 and an operation to write data to the cache memory 112 and/or a memory device 122. In some embodiments, the central controller portion 110 can control writing of multiple pages of data substantially simultaneously.

As used herein, the term "substantially" intends that the characteristic may not be absolute, but is close enough so as to achieve the advantages of the characteristic. For example, "substantially simultaneously" is not limited to operations that are performed absolutely simultaneously and can include timings that are intended to be simultaneous but due to manufacturing limitations may not be precisely simultaneously. For example, due to read/write delays that may be exhibited by various interfaces, media controllers that are utilized "substantially simultaneously" may not start or finish at exactly the same time. For example, the multiple memory controllers can be utilized such that they are writing data to the memory devices at the same time regardless if one of the media controllers commences or terminates prior to the other.

The back end portion 115 can include media control circuitry and a physical (PHY) layer that couples the controller 100 to the memory devices 122. As used herein, the term "PHY layer" generally refers to the physical layer in the Open Systems Interconnection (OSI) model of a computing system. The PHY layer can be the first (e.g., lowest) layer of the OSI model and used to transfer data over a physical data transmission medium. In some embodiments, the physical data transmission medium can include channels 125-1, . . . , 125-N (collectively referred to as the channels 125). The channels 125 can include a sixteen-pin data bus and a two pin data mask inversion (DMI) bus, for example, among other possible buses. The back end portion 115 can communicate (e.g., transmit and/or receive) data to and/or from the memory devices 122 via the data pins. Error detection information and/or error correction information, such as parity bits, can be communicated to and/or from the memory devices 122 via the DMI bus. Error detection information and/or error correction information can be communicated contemporaneously with the exchange of data.

One or more of the memory devices 122 can include dynamic random access memory (DRAM). DRAM can be operated according to a protocol, such as low-power double data rate (LPDDRx), (e.g., LPDDRx DRAM devices, LPDDRx memory, etc). The "x" in LPDDRx refers to any of a number of generations of the protocol (e.g., LPDDR5). In some embodiments, at least one of the memory devices 122 is operated as an LPDDRx DRAM device with low-power features enabled and at least one of the memory devices 122 is operated as an LPDDRx DRAM device with at least one low-power feature disabled. In some embodiments, the memory devices 122 are LPDDRx memory devices, but the memory devices 122 do not include circuitry configured to provide low-power functionality, such as a dynamic voltage frequency scaling core (DVFSC), a sub-threshold current reduce circuit (SCRC), or other low-power functionality providing circuitry. The LPDDRx memory devices 122 without such circuitry can advantageously reduce the cost, size, and/or complexity of the LPDDRx memory devices 122. By way of example, an LPDDRx memory device with reduced low-power functionality providing circuitry can be used for applications other than mobile applications (e.g., if the memory is not intended to be used in a mobile application, some or all low-power functionality can be sacrificed for a reduction in the cost of producing the memory).

In some embodiments, one or more of the memory devices 122 can have a LK-IF architecture. An example of a LK-IF architecture is described in association with FIGS.

2A-2B. One or more of the memory devices 122 can include at least one LK die coupled to an IF die by LDIO lines. A channel coupled to one of the memory devices 122 (e.g., the channel 125-1 coupled to the memory device 122-1) can include a DQ bus coupled to an IF die of the memory device.

In some embodiments, the memory controller 100 can include a management unit 105 to initialize, configure, and/or monitor characteristics of the memory controller 100. The management unit 105 can include an I/O bus to manage out-of-band data and/or commands, a management unit controller to execute instructions associated with initializing, configuring, and/or monitoring the characteristics of the memory controller, and a management unit memory to store data associated with initializing, configuring, and/or monitoring the characteristics of the memory controller 100. As used herein, the term "out-of-band data and/or commands" generally refers to data and/or commands transferred through a transmission medium that is different from the main transmission medium of a network. For example, out-of-band data and/or commands can be data and/or commands transferred to a network using a different transmission medium than the transmission medium used to transfer data within the network.

In some embodiments, the management unit 105 can be configured to provide error correction in accordance with the present disclosure. However, embodiments of the present disclosure are not so limited. For example, other portions, components, and/or circuitry of the memory controller 100 can be configured to provide error correction, individually or in combination, in accordance with the present disclosure.

In some embodiments, the controller 100, a component thereof (e.g., the management unit 105) and/or a local controller (not shown) of one or more of the memory device 122 can direct association of subsets of bits of an MTB to respective ones of LDIO lines coupling a LK die to an IF die based on a quantity of the LDIO lines. The controller 100 and/or a local controller can direct designation of pairs of bits of each of the subsets of bits. The controller 100 and/or a local controller can direct communication of the subsets of bits from the LK die to the IF die via the LDIO lines. The controller 100 and/or a local controller can, responsive to an error in communication of the subsets of bits, direct performance of a Bose-Chaudhuri-Hocquenghem (BCH) error correction on the pairs of bits. Each pair of bits can be a respective symbol for the BCH error correction. A local controller can be resident on an IF die of a memory device.

In some embodiments, one or more of the memory devices 122 can include multiple sets of a LK die and an IF die. In such embodiments, the controller 100 and/or a local controller can direct association of another subset of bits of another MTB to respective ones of LDIO lines coupling another LK die to another IF die based on a quantity of the LDIO lines. The controller 100 and/or a local controller can direct designation of pairs of bits of each of the other subsets of bits. The controller 100 and/or a local controller can direct communication of the other subsets of bits from the other LK die to the other IF die via the LDIO lines. The controller 100 and/or a local controller can, responsive to an error in communication of the other subsets of bits, direct performance of a BCH error correction (among other error corrections techniques) on the pairs of bits.

Figures 2A, 2B:
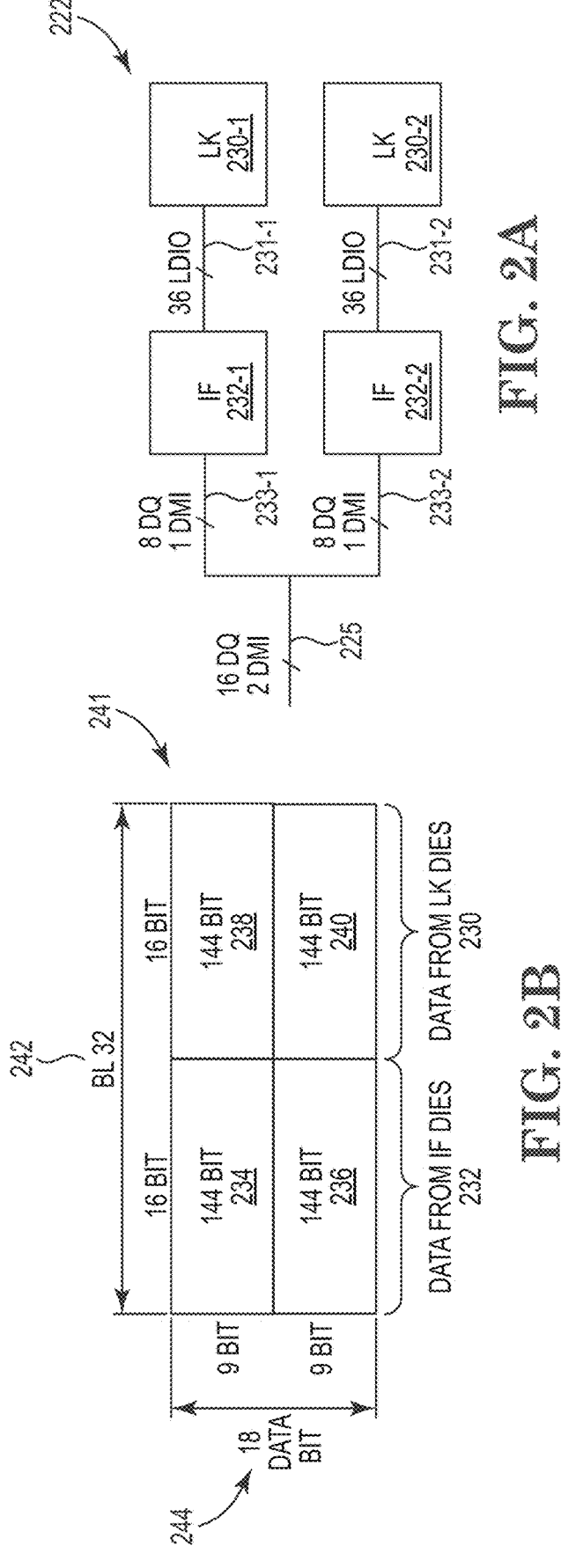
FIGS. 2A-2B are block diagrams illustrating a LK-IF architecture of a memory device in accordance with a number of embodiments of the present disclosure.

FIGS. 2A-2B are block diagrams illustrating a LK-IF architecture of a memory device in accordance with a number of embodiments of the present disclosure. The memory device 222 and the channel 225 can be analogous to any of the memory devices 122 and the channels 125 described in association with FIG. 1. An example of an LK-IF architecture is described in association with FIGS. 2A-2B. However, embodiments of the present disclosure are not limited to features and/or components (or quantities thereof) of the LK-IF architecture described in association with FIGS. 2A-2B.

FIG. 2A illustrates a memory device 222 including an LK die 230-1 coupled to an IF die 232-1 via LDIO lines 231-1 and an LK die 230-2 coupled to an IF die 232-2 via LDIO lines 231-2. In some embodiments, the LK die 230-1 and the IF die 231-1 can be considered as a memory component and the LK die 230-2 and the IF die 231-2 can be considered as another memory component.

As illustrated by FIG. 2A, the LK die 230-1 is coupled to the IF die 232-1 by 36 LDIO lines 231-1 and the LK die 230-2 is coupled to the IF die 232-2 by another 36 LDIO lines 231-2. The LDIO lines 231-1 and 231-2 enable data to be communicated from the IF dies 232-1 and 232-2 and from the LK dies 230-1 and 230-2 in parallel. Data communicated via the DQ bus 233-1 includes data communicated directly from the IF die 232-1 as well as data communicated from the LK die 230-1 to the IF die 232-1 via the LDIO lines 231-1. Similarly, data communicated via the DQ bus 233-2 includes data communicated directly from the IF die 232-2 as well as data communicated from the LK die 230-2 to the IF die 232-2 via the LDIO lines 231-2. The DQ buses 233-1 and 233-2 can cooperatively form the channel 225.

FIG. 2B is representative of an MTB 241. The MTB 241 includes data from the LK dies 230-1 and 230-2 and the IF dies 232-1 and 232-2. Rectangle 234 represents data of the MTB 241 from the IF die 232-1. Rectangle 238 represents data of the MTB 241 from the LK die 230-1. Rectangle 236 represents data of the MTB 241 from the IF die 232-2. Rectangle 240 represents data of the MTB 241 from the LK die 230-2.

A "width" of the MTB 241, at 244, corresponds to the "width" of the channel 225. The channel 225 includes 18 pins: 16 DQ pins for communicating data and 2 DMI pins for communicating parity. Eight of the 16 DQ pins correspond to the memory component including the IF die 232-1 and the LK die 230-1. The remaining 8 DQ pins correspond to the memory component including the IF die 232-2 and the LK die 230-2. One of the 2 DMI pins corresponds to the memory component including the IF die 232-1 and the LK die 230-1. The other DMI pin corresponds to the memory component including the IF die 232-2 and the LK die 230-2.

Communication of the MTB 241 includes a burst length (BL), at 242, of 32 bits via each of the 18 pins of the channel 225. Sixteen of the 32 bits come from the IF dies 232-1 and 232-2. The other 16 bits come from the LK dies 230-1 and 230-2. Thus, as illustrated by FIG. 2B, the MTB 241 includes a respective 144 bits from each of the IF dies 232-1 and 232-2 and the LK dies 230-1 and 230-2 (576 bits total, 512 data bits and 64 parity bits).

Figure 3:
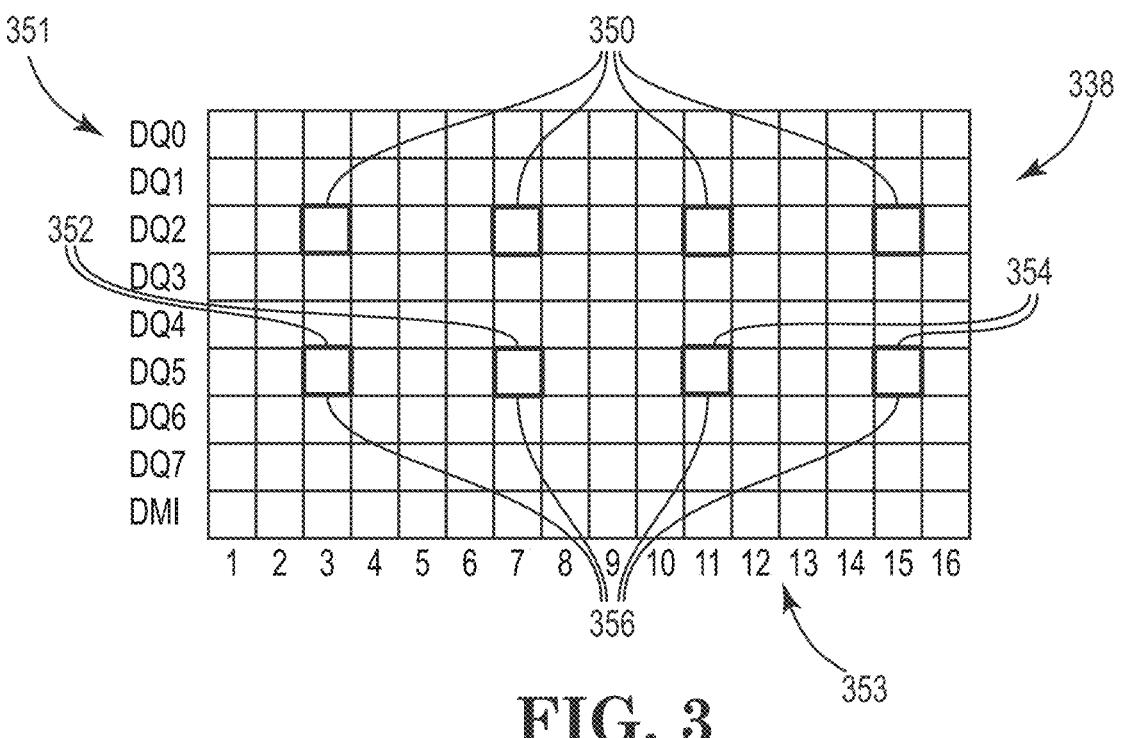
FIG. 3 is a block diagram representative of data of an MTB from a LK die in accordance with a number of embodiments of the present disclosure.

FIG. 3 is a block diagram representative of data 338 of an MTB from a LK die in accordance with a number of embodiments of the present disclosure. The data 338 can be analogous to the data 238 described in association with FIG. 2B. Although FIG. 3 is described in association with the data 338 from the LK 230-1 described in association with FIG. 2A, the description of FIG. 3 is applicable to the data 240 from the LK die 230-2.

In FIG. 3, each square represents a respective bit of the data 338. The pins of the DQ bus 233-1 are represented at 351: DQ0, DQ1, DQ2, DQ3, DQ4, DQ5, DQ6, DQ7, and DMI. Bits of the data 338 can be mapped to respective pins of the DQ bus 233-1. As illustrated by FIG. 3, bits of a row can be communicated via the corresponding pin of the DQ bus 233-1. For instance, bits of the data 338 in the row corresponding to DQ1 can be communicated (from the IF die 232-1) via the DQ1 pin of the DQ bus 233-1.

The numbers at 353 correspond to the respective 16 bits of the 32-bit burst length associated with communication of the data 338 from the LK die 230-1 via the DQ bus 233-1. Prior to communication of the data 338 via the DQ bus 233-1, the data 338 is communicated to the IF die 232-1 via 36 LDIO lines 231-1. Communication of the data 338 to the IF die 232-1 does not necessarily include storing the data 338 on the IF die 232-1 (e.g., in memory cells of the IF die 232-1).

The data 338 can be partitioned such that communication of the 144 bits of the data 338 to the IF die 232-1 is distributed evenly amongst the 36 LDIO lines 231-1. Thus, each of the LDIO lines 231-1 can communicate 4-bit subsets of the data 338 to the IF die 232-1. One such subset is the subset 350. The subset 350 can be communicated via the DQ2 pin of the DQ bus 233-1. FIG. 3 illustrates a non-limiting example of a partitioning scheme. For each respective pin (at 351), bits of columns (at 353) 1, 5, 9, and 13 can be subsets; bits of columns 2, 6, 10, and 14 can be subsets; bits of columns 3, 7, 11, and 15 can be subsets; and bits of columns 4, 8, 12, and 15 can be subsets.

If communication of a subset, such as the subset 350, via one of the LDIO lines 231-1 fails, then there is a 4-bit error in the communication of the data 338 to the IF die 232-1, and a 4-bit error in the subsequent communication of the MTB including the data 338 (e.g., the MTB 241). To facilitate correction of such errors, in some embodiments bits of the subsets are paired such that each subset includes 2 pairs of bits. For example, the subset 356 includes a first pair 352 of bits and a second pair 354 of bits.

In some embodiments, a BCH error correction code (ECC) can be implemented to correct an error resulting from a failed communication of a subset (e.g., the subset 354) via a LDIO line. The BCH ECC can be a quaternary BCH ECC. The BCH ECC can be configured to correct up to two symbols. A symbol can be a pair of bits of a subset (e.g., the pair 352). A failure of a single LDIO line corresponds to at most two symbol errors. Thus, correcting 2 symbol errors corrects a 4-bit error resulting from a failed communication of a subset via a LDIO line. Generation of the symbols can be based on partitioning of data of an MTB from a LK die (e.g., the data 338). In some embodiments, a codeword for BCH ECC can be an MTB, such as the MTB 241. For example, the codeword can be 576 bits long, which corresponds to the quantity of bits of the MTB 241.

In some embodiments, the quantity of symbols of a codeword can be half the quantity of bits of an MTB (e.g., n=288). An alphabet of the symbols can be quaternary (i.e., $q=2^b$ with b=2 bit gives q=4). A shorter primitive quaternary BCH ECC covering n has length $N=q^m-1=4^5-1=1023$. A generator polynomial of the BCH EEC can have a coefficient in $GF(4)=\{0, 1, \beta, \beta+1\}$ with $\beta^2+\beta+1=0$. Roots of the generator polynomial can belong to $GF(1024)=\{0, 1, \alpha, \alpha^2, \ldots, \alpha^{1022}\}$ where $GF(4) \subset GF(1024)$ and $\beta=\alpha^{341}$. Window roots of the generator polynomial can be $\alpha, \alpha^2, \alpha^3, \alpha^4$. Other roots of the generator polynomial can be conjugates of the window roots.

The conjugates of $\alpha$ can be $\alpha, \alpha^4, \alpha^{16}, \alpha^{64}, \alpha^{256}$. The conjugates of $\alpha^2$ can be $\alpha^2, \alpha^8, \alpha^{32}, \alpha^{128}, \alpha^{512}$. The conjugates of $\alpha^3$ can be $\alpha^3, \alpha^{12}, \alpha^{48}, \alpha^{192}, \alpha^{768}$. The conjugates of $\alpha^4$ can be $\alpha^4, \alpha^{16}, \alpha^{64}, \alpha^{256}$, a. Because the conjugates of $\alpha^4$ are duplicates, there are 15 unique roots such that deg g(x)=15. Therefore, the quantity of parity symbols of the quaternary BCH ECC over 288 symbols can be r=15. Parameters (e.g., quantity of symbols) of the primitive BCH ECC can include N=1023, K=1008, r=15. Parameters of the shortened BCH ECC can include N=288, K=273, r=15.

The quantity of parity bits to implement such a quaternary BCH ECC with a codeword 576 bits long can be 30 bits: 2 bits for each of the 15 roots. In some previous approaches can include correcting two errors or detect three errors (without correcting three errors), which can be referred to as a double error correction and triple error detection (DECTED) operation. Two DECTED operations, each with a codeword 288 bits long, can be executed to correct errors of an MTB. Because each DECTED operation needs 19 parity bits, 38 parity bits are made available. In contrast, because some embodiments of the present disclosure need 30 parity bits, 8 bits can be saved as compared to the 38 parity bits of previous approaches. In some embodiments, 8 bits can be saved for each user data block (UDB) of 64 bytes. The saved bits can be used for other purposes, such as increasing the strength of cyclic redundancy check (CRC) detection of Reliability, Availability, and Serviceability (RAS).

Figure 4:
FIG. 4 is a block diagram representative of a pairing scheme of data of an MTB from a LK die in accordance with a number of embodiments of the present disclosure.

FIG. 4 is a block diagram representative of a pairing scheme of data 438 of an MTB from a LK die in accordance with a number of embodiments of the present disclosure. The data 438 can be analogous to the data 238 described in association with FIG. 2B. Although FIG. 4 is described in association with the data 438 from the LK 230-1 described in association with FIG. 2A, the description of FIG. 4 is applicable to the data 240 from the LK die 230-2.

FIG. 4 illustrates bits of the data 438 being numbered. Bits having the same number can be paired. For instance, the subset 450 can include a pair of bits numbered 39 and another pair of bits numbered 48. The numbers can be for illustrative purposes only. Some embodiments can implement the pairing scheme illustrated by FIG. 4 without actually assigning numbers to bits. For example, bits of following columns (at 453) can be paired: 1 and 5, 9 and 13, 2 and 6, 10 and 14, 3 and 7, 11 and 15, 4 and 8, and 12 and 15.

Figure 5:
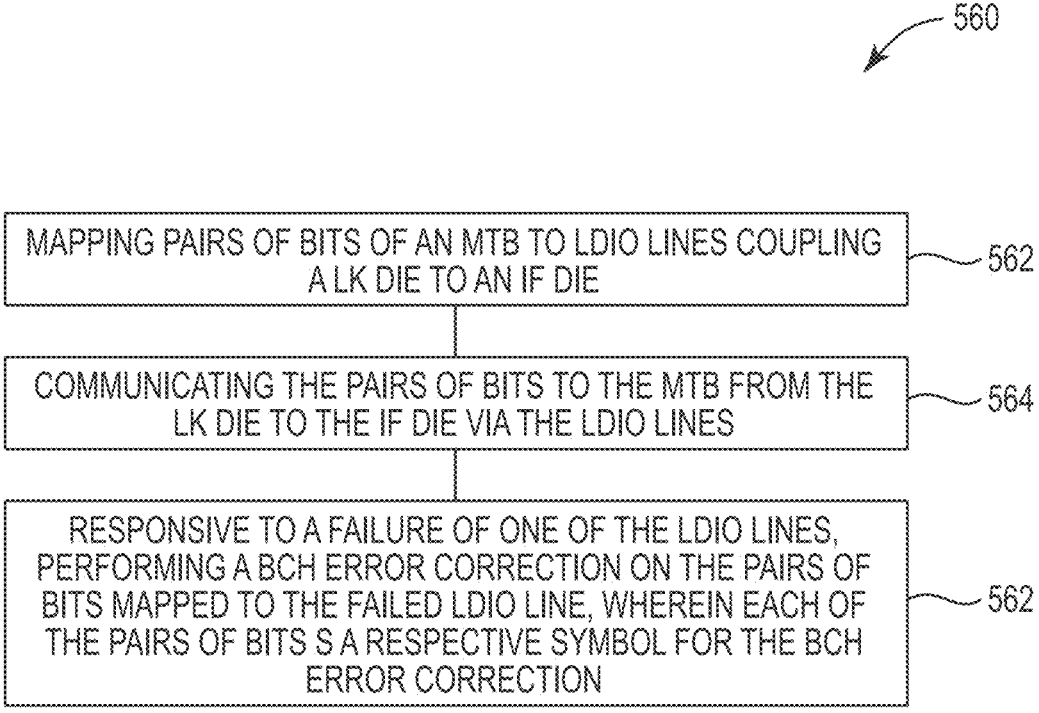
FIG. 5 is a flow diagram of a method for error correction in accordance with a number of embodiments of the present disclosure.

FIG. 5 is a flow diagram of a method 560 for error correction in accordance with a number of embodiments of the present disclosure. Any of the steps and operations of the flow diagram 560 can be performed by the memory controller 100 and/or one or more of the memory devices 122 described in association with FIG. 1.

At 562, the method 560 can include mapping a plurality of pairs of bits of an MTB to a plurality of LDIO lines coupling a LK die to an IF die. At 564, the method 560 can include communicating the plurality of pairs of bits of the MTB from the LK die to the IF die via the plurality of LDIO lines. Communicating the plurality of pairs of bits can include communicating 2 of the plurality of pairs of bits at a time via a respective LDIO line.

At 566, the method 560 can include, responsive to a failure of one of the plurality of LDIO lines, performing a BCH error correction on the pairs of bits mapped to the failed LDIO line, wherein each of the plurality of pairs of bits is a respective symbol for the BCH error correction. Performing the BCH error correction can include executing a quaternary BCH ECC on the pairs of bits mapped to the failed LDIO line.

Although not specifically illustrated by FIG. 5, the method 560 can include partitioning the plurality of bits of the MTB amongst the plurality of LDIO lines. The plurality of bits of the MTB can be partitioned evenly amongst the plurality of LDIO lines. Partitioning the plurality of bits of the MTB can include partitioning 144 bits of the MTB into 36 subsets of bits. Each respective subset of bits can include 2 of the plurality of pairs of bits.

Figure 6:
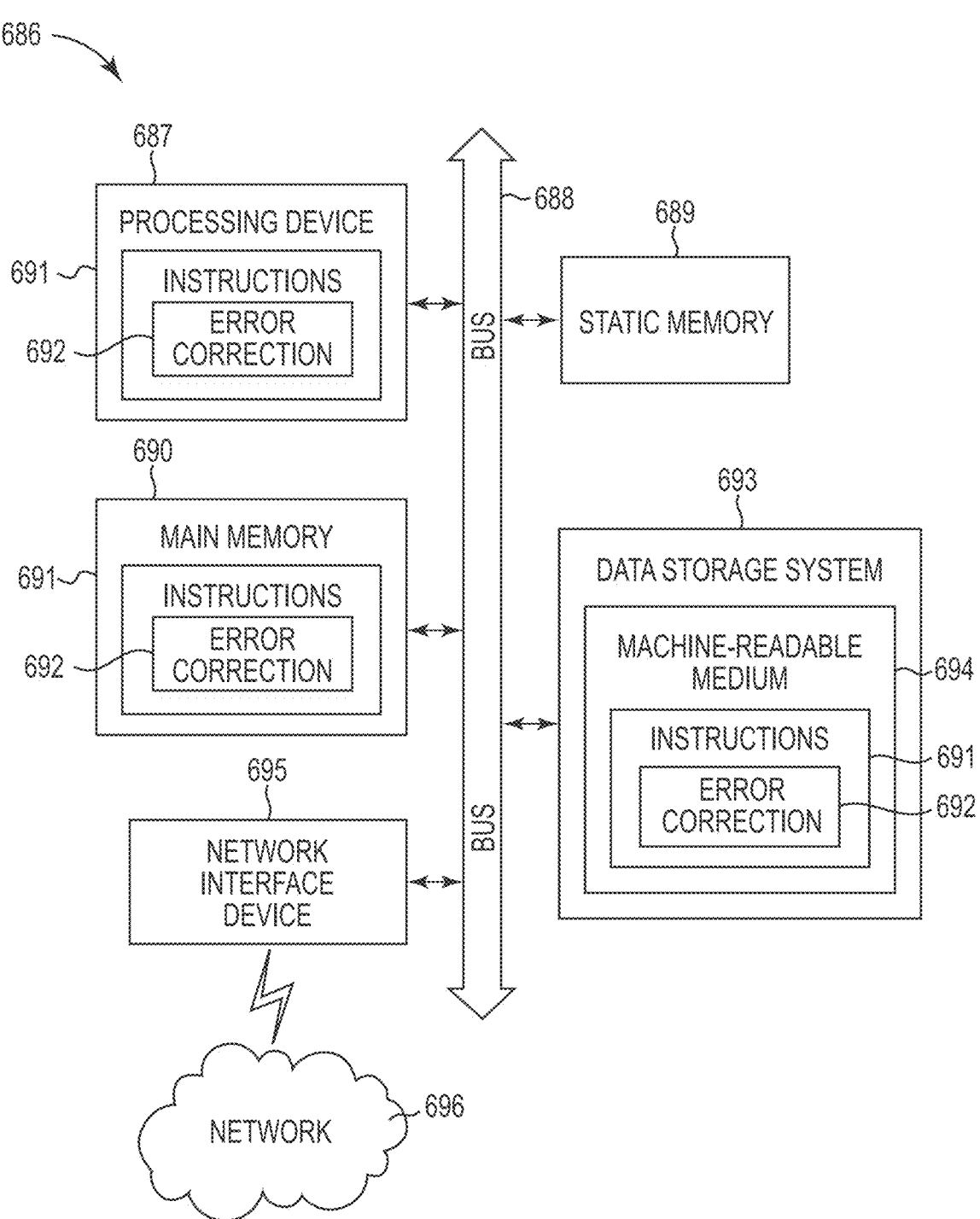
FIG. 6 is a block diagram of a computer system for error correction in accordance with a number of embodiments of the present disclosure.

FIG. 6 is a block diagram of a computer system 686 for error correction in accordance with a number of embodiments of the present disclosure. The computer system 686 can be a machine within which a set of instructions, for causing the machine to perform any one or more of the methodologies discussed herein, can be executed. In some embodiments, the computer system 686 can correspond to a host (e.g., the host 103 described in association with FIG. 1) that includes, is coupled to, or utilizes one or more memory devices (e.g., the memory devices 122) or can be used to perform the operations of a controller (e.g., the memory controller 100) to execute an operating system to perform operations associated with dual-level RFM. In alternative embodiments, the machine can be connected (e.g., networked) to other machines in a local access network (LAN), an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The computer system 686 includes a processing device 687, a main memory 690 (e.g., ROM, flash memory, DRAM such as synchronous DRAM (SDRAM) or Rambus DRAM (RDRAM), etc.), a static memory 689 (e.g., flash memory, SRAM, etc.), and a data storage system 693, which communicate with each other via a bus 688.

The processing device 687 represents one or more general-purpose processing devices such as a microprocessor, a central processing unit, or the like. More particularly, the processing device 687 can be a Complex Instruction Set Computing (CISC) microprocessor, Reduced Instruction Set Computing (RISC) microprocessor, Very Long Instruction Word (VLIW) microprocessor, or a processor implementing other instruction sets, or processors implementing a combination of instruction sets. The processing device 687 can also be one or more special-purpose processing devices such as an Application Specific Integrated Circuit (ASIC), a Field Programmable Gate Array (FPGA), a Digital Signal Processor (DSP), network processor, or the like. The processing device 687 is configured to execute instructions 691 for performing the operations and steps discussed herein. The computer system 686 can further include a network interface device 695 to communicate over the network 696.

The data storage system 693 can include a machine-readable storage medium 694 (also referred to as a computer-readable medium) on which one or more sets of instructions 691 or software embodying any one or more of the methodologies or functions described herein is stored. The instructions 691 can also reside, completely or at least partially, within the main memory 690 and/or within the processing device 687 during execution thereof by the computer system 686, the main memory 690, and the processing device 687 also constituting machine-readable storage media. In some embodiments, the machine-readable storage medium 694, data storage system 693, and/or main memory 690 can correspond to the memory devices 122.

In some embodiments, the instructions 691 can include instructions to implement functionality for error correction (represented in FIG. 6 at 692). For instance, the instructions 691 can include instructions to write a first encrypted segment of a FW package to a first portion of a volatile memory of a memory device. The instructions 691 can include instructions to cause DMA circuitry of the memory device to decrypt the first encrypted segment of the FW package to yield a first decrypted segment of the FW package written to a second portion of the volatile memory and encrypt the first decrypted segment of the FW package to yield a first re-encrypted segment of the FW package written to the first portion of the volatile memory. The instructions 691 can include instructions to write the first re-encrypted segment of the FW package from the first portion of the volatile memory to a non-volatile memory of the memory device. The instructions 691 can include instructions to, subsequent to transfer of the first re-encrypted segment of the FW package, write a second encrypted segment of the FW package to the first portion of the volatile memory; cause the DMA circuitry to decrypt the second encrypted segment of the FW package to yield a second decrypted segment of the FW package written to the second portion of the volatile memory and encrypt the second decrypted segment of the FW package to yield a second re-encrypted segment of the FW package written to the first portion of the volatile memory; and write the second re-encrypted segment of the FW package from the first portion of the volatile memory to the non-volatile memory.

The instructions 691 can include instructions to partition a plurality of bits of an MTB into a plurality of subsets of bits. Each of the plurality of subsets of bits can include a quantity of bits that is a multiple of 2. The instructions 691 can include instructions to responsive to a failed communication of the MTB, performing a BCH error correction on the MTB, wherein each of the plurality of pairs of bits is a respective symbol for the BCH error correction. The instructions 691 can include instructions to, subsequent to partitioning the plurality of bits, communicate the MTB from a LK die of a CXL compliant memory system to an IF die of the CXL compliant memory system. The instructions 691 can include instructions to communicate the plurality of subsets of bits via a plurality of LDIO lines coupling the LK die to the IF die. The instructions 691 can include instructions to map each respective subset of bits of the plurality to one of a plurality of LDIO lines via which the MTB communicated from a LK die of a CXL compliant memory system to an IF die of the CXL compliant memory system. The instructions 691 can include instructions to performing the BCH error correction on the MTB in response to a failed communication of one of the plurality of subsets of bits via the LDIO line to which the subset of bits is mapped Although the machine-readable storage medium 694 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:
partitioning a plurality of bits of a memory transfer block (MTB) into a plurality of pairs of bits;
generating symbols based on the partitioned pairs of bits and corresponding to each of the pair of bits;
communicating the plurality of pairs of bits of the MTB from a linked (LK) die to an interface (IF) die via a plurality of linked die input/output (LDIO) lines, wherein two pairs of bits of the plurality of pairs of bits are distributed to each LDIO line of the plurality of LDIO lines;
mapping the plurality of pairs of bits to pins of a data bus coupled to the IF die, wherein both of the two pairs of bits for each of the plurality of LDIO lines are mapped to the same pin of the data bus; and
responsive to detecting a failure on the data bus corresponding to one of the plurality of LDIO lines, performing a Bose-Chaudhuri-Hocquenghem (BCH) error correction on the two pairs of bits mapped to the failed LDIO line, wherein each symbol corresponding to the plurality of pairs of bits is a respective symbol for the BCH error correction.

2. The method of claim 1, wherein the plurality of bits are communicated from the LK die, through the IF die, to the data bus absent storage of the plurality of bits in the IF die.

3. The method of claim 1, wherein partitioning the plurality of bits of the MTB comprises partitioning the plurality of bits evenly amongst the plurality of LDIO lines.

4. The method of claim 1, wherein partitioning the plurality of bits of the MTB comprises partitioning 144 bits of the MTB into 36 subsets of bits,
wherein each respective subset of bits comprises 2 of the plurality of pairs of bits of the MTB.

5. The method of claim 1, wherein communicating the plurality of pairs of bits of the MTB comprises communicating 2 of the plurality of pairs of bits of the MTB at a time via a respective LDIO line of the plurality.

6. The method of claim 1, wherein performing the BCH error correction comprises executing a quaternary BCH error correction code (ECC) on the pairs of bits mapped to the failed LDIO line.

7. An apparatus, comprising:
a first linked (LK) die;
a first interface (IF) die coupled to the first LK die by a first plurality of LK die input/output (LDIO) lines;
control circuitry coupled to the first IF die and configured to direct:
association of a first plurality of subsets of bits of a memory transfer block (MTB) to respective ones of the first plurality of LDIO lines;
communication of the first plurality of subsets of bits from the first LK die to the first IF die via the first plurality of LDIO lines; and
responsive to an error in communication of the first plurality of subsets of bits, performance of a Bose-Chaudhuri-Hocquenghem (BCH) error correction on the first plurality of subsets of bits;
a second LK die; and
a second IF die coupled to the second LK die by a second plurality of LDIO lines, wherein the control circuitry is coupled to the second IF die and is further configured to direct:
association of a second plurality of subsets of bits of the MTB to respective ones of the second plurality of LDIO lines;
communication of the second plurality of subsets of bits from the second LK die to the second IF die via the second plurality of LDIO lines; and
responsive to an error in communication of the second plurality of subsets of bits, performance of the BCH error correction on the second plurality of subsets of bits.

8. The apparatus of claim 7, wherein the control circuitry, the first IF die, the first LK die, the second IF die, and the second LK die are components of a Compute Express Link (CXL) compliant memory system.

9. The apparatus of claim 7, further comprising a first bus coupled to the first IF die and a second bus coupled to the second IF die, the first bus and the second bus comprising:
a plurality of pins dedicated to communication of data bits from the first IF die and the first LK die and from the second IF die and the second LK die, respectively; and
a pin dedicated to communication of parity bits from the first IF die and the first LK die and from the second IF die and the second LK die, respectively.

10. The apparatus of claim 9, further comprising a 32 bit burst length channel coupled to the first bus and the second bus, wherein 16 bits of the channel are received from the first IF die and the first LK die via the first bus and 16 bits of the channel are received from the second IF die and the second LK die via the second bus.

11. The apparatus of claim 10, wherein the channel is configured to communicate data from the first IF die and the first LK die to a host and from the second IF die and the second LK die to the host.

12. The apparatus of claim 7, wherein the first IF die, the first LK die, the second IF die, and the second LK die comprise a memory device.

13. The apparatus of claim 12, wherein the first IF die and the first LK die comprise a first memory component of the memory device and the second IF die and the second LK die comprise a second memory component of the memory device.

14. The apparatus of claim 7, wherein each pair of bits of the first plurality of subsets of bits and each pair of bits of the second plurality of subsets of bits include a respective symbol of the BCH error correction and a failure on a single LDIO line of the first plurality of LDIO lines and the second plurality of LDIO lines corresponds to at most two symbol errors.

15. An apparatus, comprising:
control circuitry configured to:
    partition a first plurality of bits of a memory transfer block (MTB) into a first plurality of subsets of bits;
    partition a second plurality of bits of the MTB into a second plurality of subsets of bits;
    generate symbols corresponding to respective pairs of bits of the MTB, wherein the first plurality of subsets of bits and the second plurality of subsets of bits each include two symbols;
    communicate the plurality of pairs of bits of the MTB from a linked (LK) die to an interface (IF) die via a plurality of linked die input/output (LDIO) lines, wherein two pairs of bits of the plurality of pairs of bits are distributed to each LDIO line of the plurality of LDIO lines;
    map the plurality of pairs of bits to pins of a data bus coupled to the IF die, wherein both of the two pairs of bits for each of the plurality of LDIO lines are mapped to the same pin of the data bus; and
    responsive to a failed communication of the MTB, performing a Bose-Chaudhuri-Hocquenghem (BCH) error correction on the MTB, wherein each of the first plurality of subsets of bits and the second plurality of subsets of bits include two pairs of bits, wherein each pair of bits is a respective symbol for the BCH error correction.

16. The apparatus of claim 15, further comprising:
a Compute Express Link (CXL) compliant memory system comprising:
    a first linked (LK) die and a first interface (IF) die coupled to the first LK die; and
    a second LK die and a second IF die coupled to the second IF die, wherein the control circuitry is further configured to:
    subsequent to partitioning the first plurality of bits, communicate the MTB from the first LK die to the first IF die; and subsequent to partitioning the second plurality of bits, communicate the MTB from the second LK die to the second IF die.

17. The apparatus of claim 16, wherein the CXL compliant memory system further comprises a first plurality of LK die input/output (LDIO) lines and a second plurality of LDIO lines, wherein the control circuitry is further configured to:
    communicate the first plurality of subsets of bits via the first plurality of LDIO lines coupling the first LK die to the first IF die; and
    communicate the second plurality of subsets of bits via the second plurality of LDIO lines coupling the second LK die to the second IF die.

18. The apparatus of claim 15, wherein bits of the first plurality of bits and bits of the second plurality of bits are numbered and the control circuitry is further configured to:
    pair bits of the first plurality of bits that have the same number, wherein the first plurality of bits is partitioned into the first plurality of subsets of bits based on the paired bits of the first plurality of bits;
    pair bits of the second plurality of bits that have the same number, wherein the second plurality of bits is partitioned into the second plurality of subsets of bits based on the paired bits of the second plurality of bits;
    map each respective first subset of bits of the first plurality to one of a first plurality of linked (LK) die input/output (LDIO) lines via which the MTB communicated from a first LK die of a Compute Express Link (CXL) compliant memory system to a first interface (IF) die of the CXL compliant memory system; and
    map each respective second subset of bits of the second plurality to one of a second plurality of LDIO lines via which the MTB communicated from a second LK die of a CXL compliant memory system to a second IF die of the CXL compliant memory system.

19. The apparatus of claim 18, wherein the control circuitry is further configured to perform the BCH error correction on the MTB in response to a failed communication of one of the first plurality of subsets of bits or the second plurality of subsets of bits via an LDIO line to which the subset of bits is mapped.

20. The apparatus of claim 15, wherein the MTB comprises a codeword for the BCH error correction, wherein the codeword corresponds to a quantity of bits of the MTB.

* * * * *